(12) United States Patent
Morrone

(10) Patent No.: US 6,634,088 B1
(45) Date of Patent: Oct. 21, 2003

(54) METHOD AND APPARATUS FOR SHIMMING A MAGNET TO CONTROL A THREE-DIMENSIONAL FIELD

(75) Inventor: Terry Morrone, Melville, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/539,907

(22) Filed: Mar. 31, 2000

(51) Int. Cl.[7] .............................. H01F 41/02; H01F 7/02; G01V 3/00; G01R 33/28; G01R 33/20
(52) U.S. Cl. .......................... 29/607; 324/320; 324/318; 335/302; 335/296; 607/729
(58) Field of Search ............................ 324/300–322; 29/607, 729; 335/296–306, 216

(56) References Cited

U.S. PATENT DOCUMENTS

| | | | |
|---|---|---|---|
| 4,023,263 A | | 5/1977 | Postma |
| 4,853,663 A | | 8/1989 | Vermilyea |
| 4,943,774 A | | 7/1990 | Breneman et al. |
| 4,990,877 A | | 2/1991 | Benesch |
| 5,003,276 A | * | 3/1991 | Sarwinski ................. 335/304 |
| 5,539,368 A | | 7/1996 | Yamashita |
| 5,550,472 A | | 8/1996 | Richard et al. |
| 5,623,430 A | | 4/1997 | Dorri |
| 5,635,839 A | | 6/1997 | Srivastava et al. |
| 5,677,630 A | | 10/1997 | Laskaris et al. |
| 5,701,075 A | | 12/1997 | Xu et al. |
| 5,992,006 A | * | 11/1999 | Datsikas ................. 29/607 |
| 6,504,462 B1 | * | 1/2003 | Datsikas ................. 335/301 |

* cited by examiner

Primary Examiner—Diego Gutierrez
Assistant Examiner—Tiffany A. Fetzner
(74) Attorney, Agent, or Firm—IP Strategies, P.C.

(57) ABSTRACT

A magnetic field produced by a magnet is measured and modeled as a sum of additive components, each having a different symmetry with respect to the three-dimensional field. The sum of all the additive components completely describes the measured magnetic field, without approximation due to truncation of terms. The degree of non-homogeneity in the measured field is determined by examining the additive components individually. A shim is designed to correspond to a magnitude change of an additive component in order to improve the homogeneity of the magnetic field, such as in an MRI application. The shim is placed in a predetermined location against a metal plate that is connected to or placed near a pole of the magnet, and a plastic plate is attached to the metal plate to hold the shim in place. Grooves are machined into corresponding symmetrical plate locations to complement the shim effect.

26 Claims, 6 Drawing Sheets

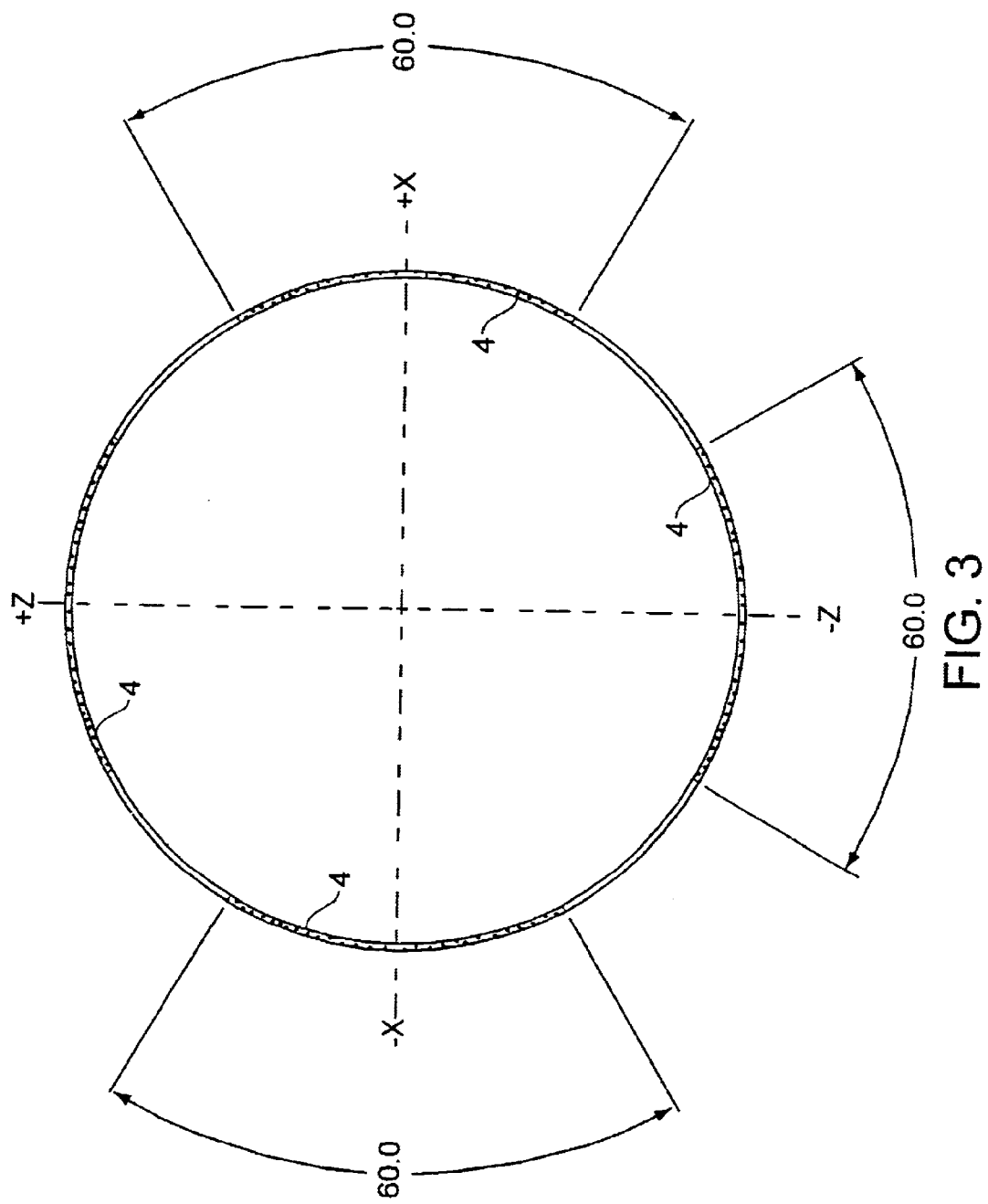

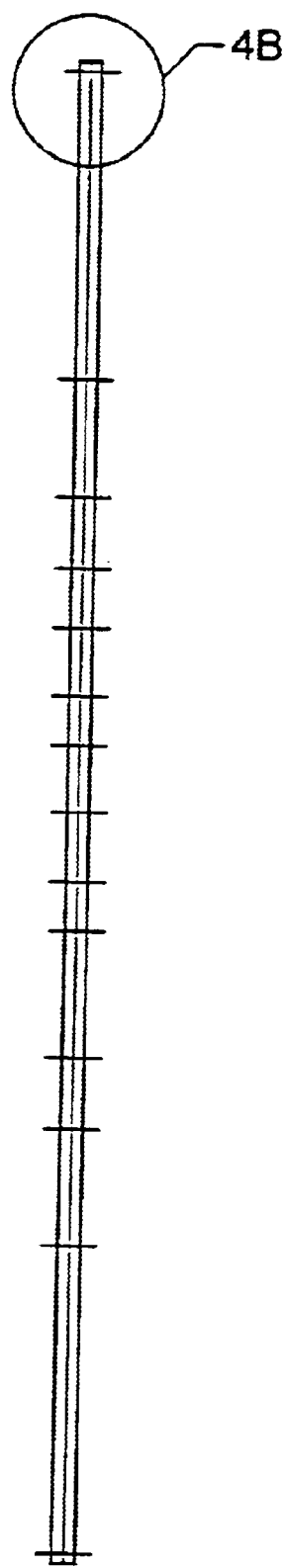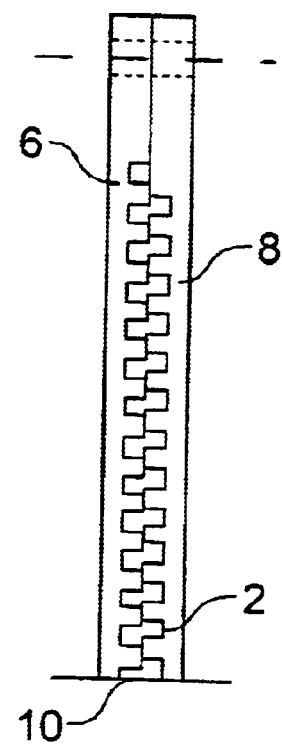
FIG. 4A
FIG. 4B

METHOD AND APPARATUS FOR SHIMMING A MAGNET TO CONTROL A THREE-DIMENSIONAL FIELD

CROSS-REFERENCE TO RELATED PATENTS AND APPLICATIONS

The subject matter disclosed herein is related to that disclosed in U.S. Pat. No. 5,992,006, which was issued to Thomas Datsikas on Nov. 30, 1999. This subject matter is also related to that disclosed in co-pending U.S. patent application Ser. No. 09/365,255, which was filed on Jul. 30, 1999, and that disclosed in U.S. patent application Ser. No. 09/365,257, which was filed on Jul. 30, 1999.

FIELD OF THE INVENTION

In general, the present invention relates to a method and apparatus for shimming a magnet. In particular, the present invention is a method for determining the placement of shim elements, and an apparatus used to place the shim elements in specific locations on the pole surface of a magnet in order to shape the magnetic field to achieve greater uniformity.

BACKGROUND OF THE INVENTION

Magnetic resonance imaging ("MRI") is one of the most versatile and fastest growing modalities in medical imaging. As part of the MRI process, the subject patient is placed in an external magnetic field. This field is created by a magnet assembly, which may be closed or open. Open magnet assemblies have two spaced-apart magnet poles separated by a gap, and a working magnetic field volume located within the gap.

The diagnostic quality of images produced by MRI is directly related to several system performance characteristics. One very important consideration is the uniformity, or homogeneity, of the main magnetic field. In order to produce high-resolution images, the magnetic field produced in the MRI scanner must be maintained to a very high degree of uniformity. However, an MRI magnet initially produces a field that is usually less uniform than that required to image successfully. At some point after manufacture, the magnet assembly must be adjusted to produce a more uniform field.

A process known as shimming is used to improve the homogeneity of the magnetic field to the necessary levels by making small mechanical and/or electrical adjustments to the overall field. Mechanical adjustments are called passive shimming, while electrical adjustments are known as active shimming. Electrical adjustments are effective because electrical current passing through a wire will produce a magnetic field around that wire. When these wires are formed into coils, the strength, direction, and shape of the magnetic field produced can be controlled by adjusting the physical and electrical parameters of the coils. Placing these coils in strategic locations as secondary magnetic field sources has the effect of adding to or subtracting from the main magnetic field in localized regions as well as over the entire pole surface, affecting the overall homogeneity of the main field. While the use of these "shim coils" has allowed the homogeneity of the main MRI magnetic field to be greatly improved, there are numerous drawbacks associated with their use.

For example, the electric current in the shim coils may be unstable, resulting in an overall instability in the main magnetic field. This instability may cause "ghosting" in the MR images. Ghosting is an interference phenomenon that appears at periodic intervals along the phase axis. These errors are unacceptable to any radiologist, who may confuse the correct position of the patient's anatomic elements, possibly resulting in an incorrect diagnosis.

Further, shim coils are temperature sensitive. Variations in the temperature of the individual coils can cause instabilities in the main magnetic field, resulting in image artifacts. In addition, the currents used to produce the magnetic fields in the shim coils require complicated electronic circuits, such as voltage and current regulators and current amplifiers, to maintain stability. The shim coil can become inoperable when one or more of these electronic components breaks or goes out of tolerance. Even when all the electronic components are working properly, this type of active shimming adds expense and complexity to the overall MRI system. Passive shimming avoids adding complexity to the MRI system, but instead makes manufacture of the magnets more complicated, usually by requiring the custom physical modification of the magnet core components, such as shim bars, while adjusting the uniformity of the field produced by the newly-manufactured magnet.

It is common practice to represent the field in terms of a complete set of functions such as spherical harmonics, and to apply shims that attempt to reduce the amplitude of one of the functions. After one of the terms has been reduced to an acceptable level, the next term is considered. The problem with this method is that there may be many significant functions in an accurate representation of the field. To shim them one at a time is a long and tedious process.

Further, it is usually impossible to produce a shim that affects only a single higher order function such as a spherical harmonic. So instead of trying to shim the terms one at a time, the total field is shimmed all at once. Using particular modeling systems in which the approximation to the actual field is optimized when a large number of sequence terms is measured, inaccuracies result due to complex interdependencies and accumulated errors.

There is therefore a great need for a method of shimming a magnet to control the homogeneity of the resulting field that is accurate and efficient, in terms of both the time and the computational resources required to produce the desired homogeneity. The need also exists for an apparatus that may be used to effectively implement the method.

SUMMARY OF THE INVENTION

To overcome these and other disadvantages of the active (coil) shimming process, the present invention eliminates or minimizes the use of some or all shim coils and their associated currents altogether, achieving a high degree of field uniformity required for high resolution imaging through a process using only passive shimming. The shimming is effected through the use of metal shim elements that are added to the standard magnet in order to physically influence the overall field produced by the magnet. The shim elements may be held in place by a non-metallic cover that is affixed to the magnet. Preferably, a metal plate may be applied between the magnet and the non-metallic cover to incorporate a combination of shim elements in the form of additive metal elements, and other shim elements in the form of areas where metal has been removed from the metal plate. To overcome the disadvantages of conventional passive shimming techniques, the present invention provides a process for modeling the field and determining the physical parameters of the shim elements that is accurate and computationally straightforward.

According to an aspect of the present invention, a method for passively shimming a magnet includes measuring a magnetic field produced within a predetermined volume by the magnet, at selected points within the volume; modeling the measured magnetic field in the form of a plurality of additive components; detecting the degree of homogeneity in the measured field within the predetermined volume by examining measured magnetic field values at ones of the selected points corresponding to individual ones of the plurality of additive components; determining which additive component should be modified in order to change the homogeneity detected in the measured field; and coupling a metal element that provides the determined additive component modification when coupled to the magnet. Preferably, measuring the magnetic field includes producing magnetic field data for the measured points on a plane disposed with respect to a three-dimensional coordinate system, and modeling the measured magnetic field includes analyzing the magnetic field data and describing the analyzed data as the plurality of additive components, wherein each of the plurality of additive components has a particular symmetry with respect to the coordinate system. In a preferred embodiment, the plurality of additive components are eight additive components $g_i$, such that for the field $$f(x, y, z) = \sum_{i=1}^{8} g_i,$$

$8g_1 = f(x, y, z) + f(-x, y, z) + f(x, -y, z) + f(-x, -y, z) + f(x, y, -z) + f(-x, y, -z) + f(x, -y, -z) + f(-x, -y, -z);$ $8g_2 = f(x, y, z) + f(-x, y, z) + f(x, -y, z) + f(-x, -y, z) - f(x, y, -z) - f(-x, y, -z) - f(x, -y, -z) - f(-x, -y, -z);$ $8g_3 = f(x, y, z) + f(-x, y, z) - f(x, -y, z) - f(-x, -y, z) + f(x, y, -z) + f(-x, y, -z) - f(x, -y, -z) - f(-x, -y, -z);$ $8g_4 = f(x, y, z) + f(-x, y, z) - f(x, -y, z) - f(-x, -y, z) - f(x, y, -z) - f(-x, y, -z) + f(x, -y, -z) + f(-x, -y, -z);$ $8g_5 = f(x, y, z) - f(-x, y, z) + f(x, -y, z) - f(-x, -y, z) + f(x, y, -z) - f(-x, y, -z) + f(x, -y, -z) - f(-x, -y, -z);$ $8g_6 = f(x, y, z) - f(-x, y, z) + f(x, -y, z) - f(-x, -y, z) - f(x, y, -z) + f(-x, y, -z) - f(x, -y, -z) + f(-x, -y, -z);$ $8g_7 = f(x, y, z) - f(-x, y, z) - f(x, -y, z) + f(-x, -y, z) + f(x, y, -z) - f(-x, y, -z) - f(x, -y, -z) + f(-x, -y, -z);$ and $8g_8 = f(x, y, z) - f(-x, y, z) - f(x, -y, z) + f(-x, -y, z) - f(x, y, -z) + f(-x, y, -z) + f(x, -y, -z) - f(-x, -y, -z);$ wherein, y, and z are coordinates in the three-dimensional coordinate system.

According to another aspect of the invention, an apparatus for changing a homogeneity of a magnetic field produced by a magnet includes a first plate for placement near enough to the pole of the magnet so as to have an effect on the magnetic field, a shim for placement near enough to the first plate so as to have an effect on the magnetic field, and a second plate for attachment to the first plate such that the shim is held in place in a predetermined location between the first plate and the second plate. The shim corresponds to a magnitude change of an additive component of an equation describing the magnetic field, in order to change the homogeneity of the magnetic field. The additive component has a particular symmetry with respect to a three-dimensional coordinate system oriented with respect to a location of the pole. Preferably, the equation is $$f(x, y, z) = \sum_{i=1}^{8} g_i,$$

and the additive component is one of $g_i$, i ={1,2,3,4,5,6,7,8}, wherein $8g_1 = f(x, y, z) + f(-x, y, z) + f(x, -y, z) + f(-x, -y, z) + f(x, y, -z) + f(-x, y, -z) + f(x, -y, -z) + f(-x, -y, -z);$ $8g_2 = f(x, y, z) + f(-x, y, z) + f(x, -y, z) + f(-x, -y, z) - f(x, y, -z) - f(-x, y, -z) - f(x, -y, -z) - f(-x, -y, -z);$ $8g_3 = f(x, y, z) + f(-x, y, z) - f(x, -y, z) - f(-x, -y, z) + f(x, y, -z) + f(-x, y, -z) - f(x, -y, -z) - f(-x, -y, -z);$ $8g_4 = f(x, y, z) + f(-x, y, z) - f(x, -y, z) - f(-x, -y, z) - f(x, y, -z) - f(-x, y, -z) + f(x, -y, -z) + f(-x, -y, -z);$ $8g_5 = f(x, y, z) - f(-x, y, z) + f(x, -y, z) - f(-x, -y, z) + f(x, y, -z) - f(-x, y, -z) + f(x, -y, -z) - f(-x, -y, -z);$ $8g_6 = f(x, y, z) - f(-x, y, z) + f(x, -y, z) - f(-x, -y, z) - f(x, y, -z) + f(-x, y, -z) - f(x, -y, -z) + f(-x, -y, -z);$ $8g_7 = f(x, y, z) - f(-x, y, z) - f(x, -y, z) + f(-x, -y, z) + f(x, y, -z) - f(-x, y, -z) - f(x, -y, -z) + f(-x, -y, -z);$ and $8g_8 = f(x, y, z) - f(-x, y, z) - f(x, -y, z) + f(-x, -y, z) - f(x, y, -z) + f(-x, y, -z) + f(x, -y, -z) - f(-x, -y, -z);$ wherein the pole is disposed on the z-axis. In particular cases, the additive component is a first additive component having a first particular symmetry with respect to the three-dimensional coordinate system. In such a case, the first plate includes a grooved portion that corresponds to a magnitude change of a second additive component of the equation describing the magnetic field, in order to change the homogeneity of the magnetic field, and the second additive component has a second particular symmetry with respect to the three-dimensional coordinate system.

According to a further aspect of the present invention, an apparatus for changing a homogeneity of a magnetic field produced by a magnet includes a shim and a plate for attachment to the magnet such that the shim is held in place in a predetermined location between the magnet and the plate. The shim corresponds to a magnitude change of an additive component of an equation describing the magnetic field, in order to change the homogeneity of the magnetic field. The additive component has a particular symmetry with respect to a three-dimensional coordinate system oriented with respect to a location of the pole. Preferably, the equation is $$f(x, y, z) = \sum_{i=1}^{8} g_i,$$

and the additive component is one of $g_i$, i={1,2,3,4,5,6,7,8}, wherein $8g_1 = f(x, y, z) + f(-x, y, z) + f(x, -y, z) + f(-x, -y, z) + f(x, y, -z) + f(-x, y, -z) + f(x, -y, -z) + f(-x, -y, -z);$ $8g_2 = f(x, y, z) + f(-x, y, z) + f(x, -y, z) + f(-x, -y, z) - f(x, y, -z) - f(-x, y, -z) - f(x, -y, -z) - f(-x, -y, -z);$ $8g_3 = f(x, y, z) + f(-x, y, z) - f(x, -y, z) - f(-x, -y, z) + f(x, y, -z) + f(-x, y, -z) - f(x, -y, -z) - f(-x, -y, -z);$ $8g_4 = f(x, y, z) + f(-x, y, z) - f(x, -y, z) - f(-x, -y, z) - f(x, y, -z) - f(-x, y, -z) + f(x, -y, -z) + f(-x, -y, -z);$ $8g_5 = f(x, y, z) - f(-x, y, z) + f(x, -y, z) - f(-x, -y, z) + f(x, y, -z) - f(-x, y, -z) + f(x, -y, -z) - f(-x, -y, -z);$ $8g_6 = f(x, y, z) - f(-x, y, z) + f(x, -y, z) - f(-x, -y, z) - f(x, y, -z) + f(-x, y, -z) - f(x, -y, -z) + f(-x, -y, -z);$ $8g_7 = f(x, y, z) - f(-x, y, z) - f(x, -y, z) + f(-x, -y, z) + f(x, y, -z) - f(-x, y, -z) - f(x, -y, -z) + f(-x, -y, -z);$ and $8g_8 = f(x, y, z) - f(-x, y, z) - f(x, -y, z) + f(-x, -y, z) - f(x, y, -z) + f(-x, y, -z) + f(x, -y, -z) - f(-x, -y, -z);$ wherein the pole is disposed on the z-axis. In particular cases, the additive component is a first additive component having a first particular symmetry with respect to the three-dimensional coordinate system. In such cases, the magnet includes a grooved portion that corresponds to a magnitude change of a second additive component of the equation describing the magnetic field, in order to change the homogeneity of the magnetic field, and the second additive component has a second particular symmetry with respect to the three-dimensional coordinate system.

BRIEF DESCRIPTION OF THE DRAWINGS

FIG. 3 shows exemplary metal shim elements for the shim plate of the present invention.

FIGS. 4(a) and 4(b) show an exemplary metal/non-metal shim plate construction of the present invention.

DETAILED DESCRIPTION OF THE INVENTION

Figure 1:
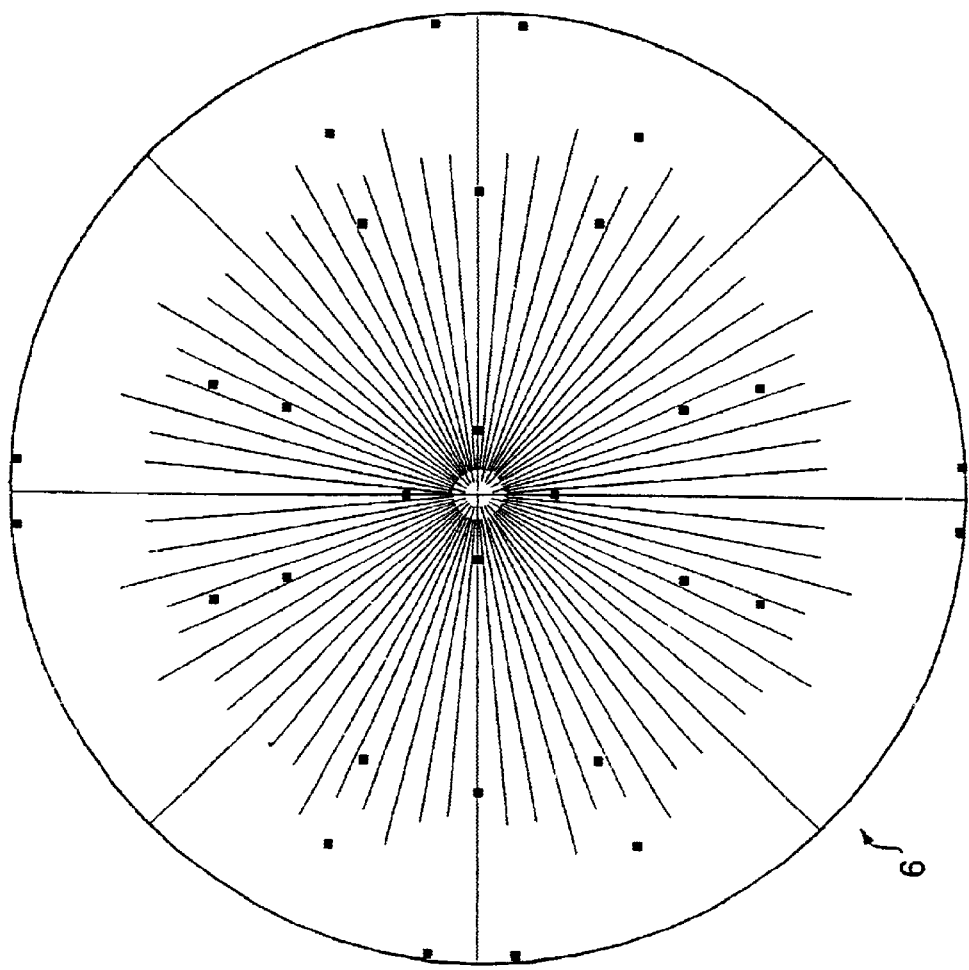
FIG. 1 shows an exemplary metal shim plate of the present invention.

According to the present invention, a method and apparatus for modifying the uniformity of a magnetic field formed by a magnet assembly are described. The following description uses the example of modification of the main magnetic field created by an MRI magnet assembly. However, the present invention is applicable to control of any modification of a magnetic field created by a magnet or magnet assembly, including applications where the intent is to make the field less uniform. Thus, the examples described herein are not intended to limit the scope of the invention to any particular use or result.

1. Mapping Procedure

According to the method of the present invention, the field of the magnet assembly is mapped, that is, measured, to determine the extent of the nonhomogeneity.

In order to do so, the representation of the magnetic field is separated, preferably into eight components. If the eight components are summed up, or superposed, the original field is recovered (702). The resulting summation is an exact representation of the measured magnetic field, which is not the case if another model were utilized to approximate the field. For example, a finite number of spherical harmonics would result in an approximation of the field, with the disparity from the actual field depending on the number of spherical harmonic terms used.

Each of the eight additive components represents a particular symmetry of the field. To demonstrate the essence of the modeling scheme of the invention in its simplest form, consider a one-dimensional field f(x). This can be written as a sum of odd and even components:

$$f(x) = \frac{f(x) + f(-x)}{2} + \frac{f(x) - f(-x)}{2}$$

The first component is even in x and the second is odd in x. In this example, the field is separated into two components which, when added, recover the original field.

Once the field is modeled in this manner, and the components of the measured field are matched with corresponding modeled components, the homogeneity of the field can be adjusted by shimming appropriate components of the field. Consider that adding or subtracting a piece of steel at a point on a magnet assembly modifies the field near that point. Thus, to shim the odd part of the field that, for example, decreases with increasing x, a piece of steel is added at x positive and a corresponding piece is subtracted at x negative.

To shim the even part of f(x), equal amounts of steel would be added and subtracted at x positive and x negative.

Continuing the example in two dimensions, the field f(x, y) may be represented as $f(x, y) = g_1 + g_2 + g_3 + g_4$, where:

$4g_1 = [f(x, y) + f(-x, y) + f(x, -y) + f(-x, -y)]$ $4g_2 = [f(x, y) + f(-x, y) - f(x, -y) - f(-x, -y)]$ $4g_3 = [f(x, y) - f(-x, y) + f(x, -y) - f(-x, -y)]$ $4g_4 = [f(x, y) - f(-x, y) - f(x, -y) + f(-x, -y)]$

Thus, $g_1$ is even in both x and y; $g_2$ is even in x, but odd in y; $g_3$ is even in y, but odd in x; and $g_4$ is odd in both x and y. Adopting the notation that −1 represents odd and 1 represents even, the 4 symmetries can be written as:

|       | x  | y  |
|-------|----|----|
| $g_1$: | 1  | 1  |
| $g_2$: | 1  | −1 |
| $g_3$: | −1 | 1  |
| $g_4$: | −1 | −1 |

In three dimensions, there are eight possible symmetries, which can be represented as:

|       | x  | y  | z  |
|-------|----|----|----|
| $g_1$: | 1  | 1  | 1  |
| $g_2$: | 1  | 1  | −1 |
| $g_3$: | 1  | −1 | 1  |
| $g_4$: | 1  | −1 | −1 |
| $g_5$: | −1 | 1  | 1  |
| $g_6$: | −1 | 1  | −1 |
| $g_7$: | −1 | −1 | 1  |
| $g_8$: | −1 | −1 | −1 |

As shown, the first term is even in x, y, and z; the second term is even in x and y, but odd in z; and so on, according to the notation set forth above. The additive components giving rise to these symmetries are set forth as follows:

For $$f(x, y, z) = \sum_{i=1}^{8} g_i,$$

$8g_1 = f(x, y, z) + f(-x, y, z) + f(x, -y, z) + f(-x, -y, z) + f(x, y, -z) + f(-x, y, -z) + f(x, -y, -z) + f(-x, -y, -z)$ $8g_2 = f(x, y, z) + f(-x, y, z) + f(x, -y, z) + f(-x, -y, z) - f(x, y, -z) - f(-x, y, -z) - f(x, -y, -z) - f(-x, -y, -z)$ $8g_3 = f(x, y, z) + f(-x, y, z) - f(x, -y, z) - f(-x, -y, z) + f(x, y, -z) + f(-x, y, -z) - f(x, -y, -z) - f(-x, -y, -z)$ $8g_4 = f(x, y, z) + f(-x, y, z) - f(x, -y, z) - f(-x, -y, z) - f(x, y, -z) - f(-x, y, -z) + f(x, -y, -z) + f(-x, -y, -z)$ $8g_5 = f(x, y, z) - f(-x, y, z) + f(x, -y, z) - f(-x, -y, z) + f(x, y, -z) - f(-x, y, -z) + f(x, -y, -z) - f(-x, -y, -z)$ $8g_6 = f(x, y, z) - f(-x, y, z) + f(x, -y, z) - f(-x, -y, z) - f(x, y, -z) + f(-x, y, -z) - f(x, -y, -z) + f(-x, -y, -z)$ $8g_7 = f(x, y, z) - f(-x, y, z) - f(x, -y, z) + f(-x, -y, z) + f(x, y, -z) - f(-x, y, -z) - f(x, -y, -z) + f(-x, -y, -z)$ $8g_8 = f(x, y, z) - f(-x, y, z) - f(x, -y, z) + f(-x, -y, z) - f(x, y, -z) + f(-x, y, -z) + f(x, -y, -z) - f(-x, -y, -z)$

The foregoing equations demonstrate how to separate any function of f(x, y, z) into its eight symmetrical components.

Figure 5:
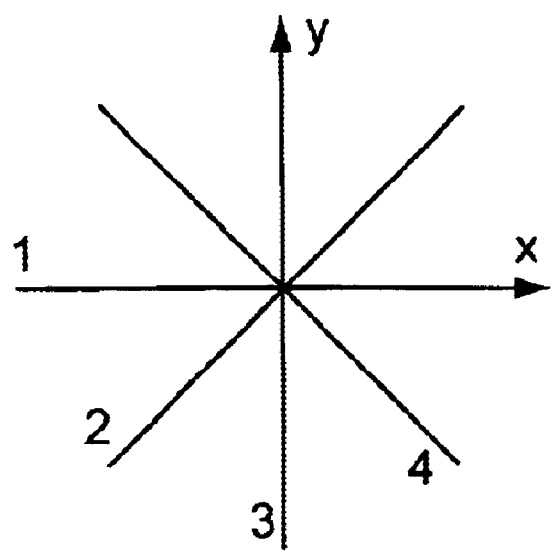
FIG. 5 shows a preferred space in which the subject field is measured.

When shimming magnets, the field is measured only at particular values of x, y, and z, in order to determine the degree of homogeneity of the field (703). According to one procedure of the present invention, the field is measured at points on a rectangular grid in four planes. The planes preferably are disposed 45 degrees apart from each other. Consider the case of a vertical field magnet with poles located at z=+/−L. The field is measured in planes that are perpendicular to the poles. Looking down the z-axis, the four plane preferably are located as shown in FIG. 5.

Thus, the field may be represented by values on four rectangular arrays, one array for each plane. To evaluate a function such as f(−x, y, z), in the first plane, the map of the field is simply reflected about the x=0 line. In plane 2, values from plane 4 would be taken to find f(−x, y, z). In this way, the components $g_i$ can be evaluated and the field represented by eight sets of four maps each. Each set of four maps is a field that is symmetrical or asymmetrical in accordance with one of the eight symmetries listed above.

2. Shimming Procedure

According to the present invention, a shimming procedure that is intermediate between shimming a single term and shimming the entire field is utilized. That is, components corresponding to the eight symmetries are shimmed one at a time, in order to manipulate the homogeneity of the field.

The magnet, which may be, for example, an iron core magnet, or a superconductor magnet, is shimmed by placing metal elements having specified physical dimensions and permeability $\mu$ on the pole faces of the magnet, or by subtracting metal elements from the pole face by, for example, machining grooves of the same dimensions, to increase or decrease portions of the field attributable to the modeled components $g_i$. Preferably, for each modification of the field, corresponding shims are added and subtracted at the appropriate locations. As a result, the magnitude of the change is only substantially half the change that would necessary if the change were made at only one location.

Thus, a smaller amount of metal can be added as a shim and a smaller groove can be machined to achieve the same overall result.

Each of these magnitude changes is created with metal elements. By calculation using a finite element program, or by measurement, the change in magnetic field due to placement of circular steel rings or arcuate segments of varying length and radii may be determined, as well as the effect of corresponding grooves. Using this information in an optimization program, the configuration of arcs that will shim one of the eight symmetry components may be determined (704). Each of the eight symmetry components is shimmed and machined separately, independently of the other symmetry components. Summation of the independently-shimmed symmetry components reconstructs a representation of the actual field. Thus, prudent selection of shim elements and grooves to manipulate the individual symmetry components enables control of the homogeneity of the field in a very predictable manner.

In practice, the effect of each metal shim ring or arc segment is mapped at closely spaced radii, and the components are plotted to reveal the optimum location. If a negative effect is required, grooves may be machined in the magnet instead, to effect a decrease in magnitude of the unwanted corresponding component. If the magnet is to remain unmodified, an attachment to the magnet poles may be modified instead, as described below.

Figure 6:
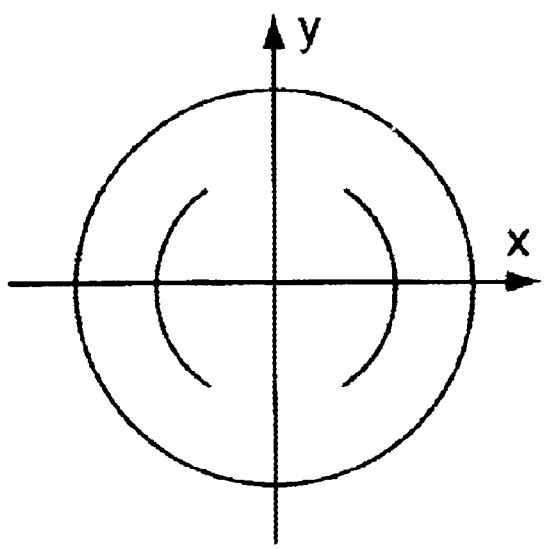
FIG. 6 shows an exemplary plate orientation for determining the placement of shims and grooves according to the present invention.
Figure 7:
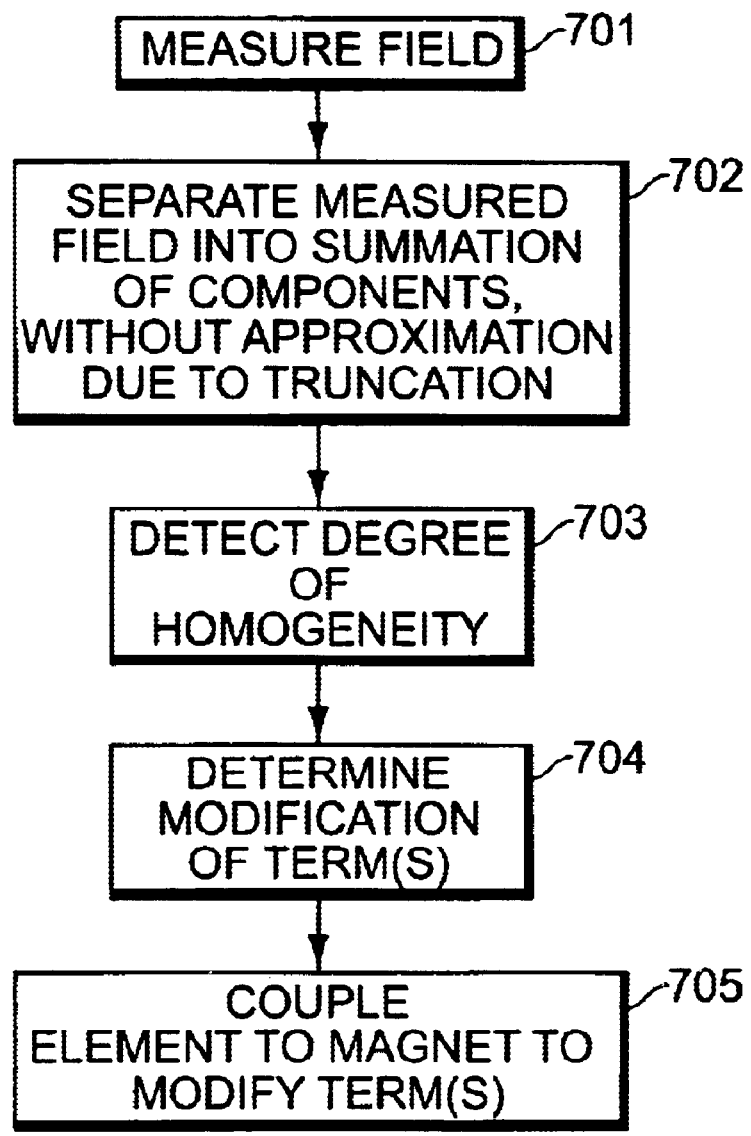
FIG. 7 is a flow diagram showing an exemplary embodiment of the method of the present invention.

For example, consider a magnetic field produced at poles located at z=±L, and with x and y axes oriented as shown in FIG. 6. In order to affect the field in a manner that is uniform in three-dimensional space, the same modification (adding or subtracting the same amount of metal) should be made in corresponding places symmetrically about the x, y, and z axes. The addition of these elements will shift the central field, but this is of no consequence because the central field can be shifted in an electromagnet by changing the current without appreciably affecting field homogeneity.

In order to produce an x gradient term, that is, affect an x term of a field component, a steel arc may be added on the +x axis, while a corresponding arc is subtracted on the −x axis. As a result, the x gradient term will be affected, while ±y and ±z terms would get equal respective perturbations. Likewise, to produce a field component term that is odd in x and z but even in y, arcs would be added in corresponding locations where 1) x>0, z<0 and 2) x<0, z>0, and subtracted in corresponding locations where 3) x<0, z<0 and 4) x>0, z>0.

The exact locations are determined by the optimization program, which calculates the ideal location for the shims and grooves. In some situations, however, it may be impractical to add or subtract steel from the precise locations called for by the program. In such cases, the field may still be improved by adding shims and providing grooves in locations close to the optimum locations. Further, it may be impossible in certain situations to remove the calculated amount of steel, or any steel at all. In these cases, symmetry can be approximated by adding steel in the determined locations, but not uniformly. For example, if the program calls for adding a shim in a first location and providing a groove in a second location, a small shim may instead be added in the second location, and a larger shim than that calculated by the program can be added in the first location. In this way, the relative difference between the two locations is preserved in order to approximate the field modification.

Once the magnitudes for modification of each component have been calculated, the degree of homogeneity required for the particular application is satisfied in one of four ways. First, the mass of each metal element ring or arc may be adjusted by varying the thickness and/or width. Second, portions of the metal arcs may be symmetrically eliminated, effectively transforming a full ring of metal into an assembly of arc segments 4, as shown in FIG. 3 for example. Third, metal of a different magnetic permeability $\mu$ may be used to shim, whereby the magnitude of the effect of the ferromagnetic material can be variable for a constant amount of shim material. Fourth, using the concept of employing ferromagnetic materials with different magnetic permiabilities $\mu$, one can generalize to the construction of an entire pole.

Figure 2:
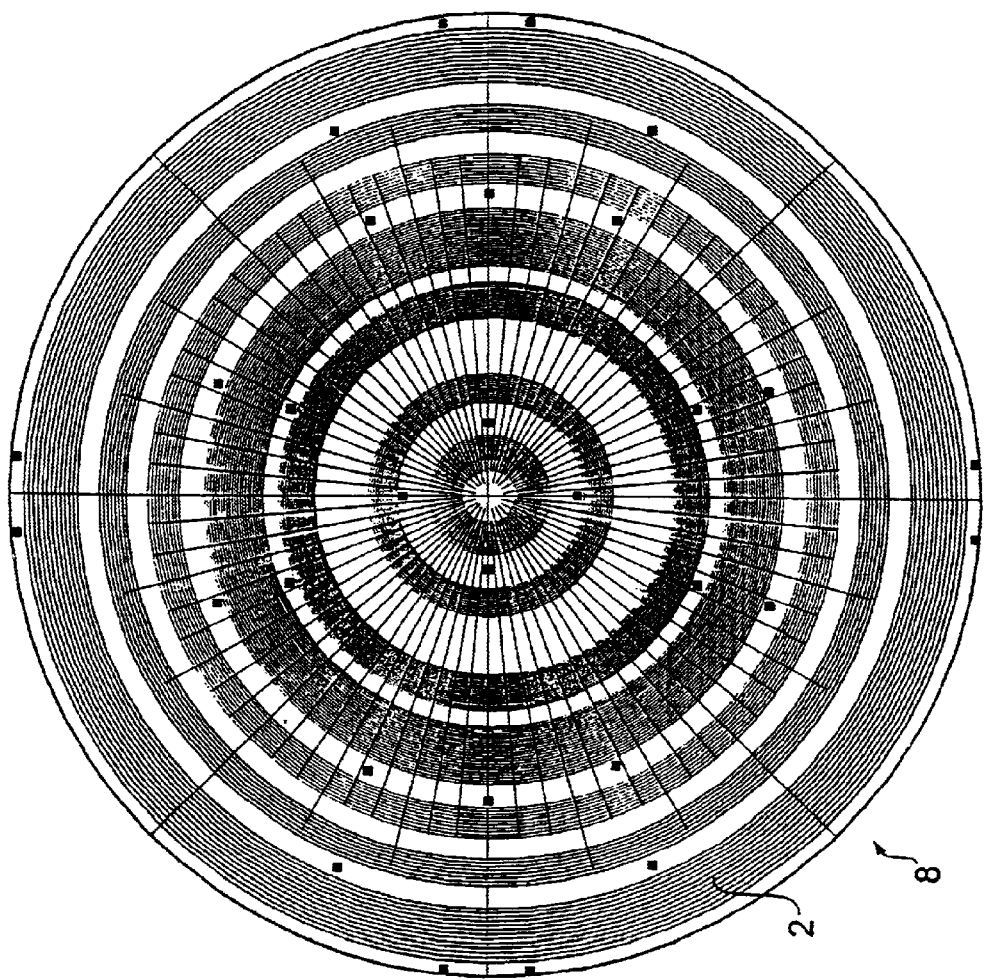
FIG. 2 shows an exemplary non-metal shim plate of the present invention.

Once the arc segments and complete rings have been designed they must be applied to the magnet in some manner (705). A preferred embodiment of the present invention includes an apparatus that can be used to attach the shim elements to the magnet. The apparatus consists of two plates for each pole. Exemplary plates (6) and (8) are shown in FIGS. 1 and 2, respectively. As shown, plate (6) is a metal plate having a permeability $\mu$, which is affixed, preferably bolted, onto the magnet pole. Initially the plate is flat and is part of the magnet assembly. This plate will accommodate both the shim elements and the grooves, so that the magnet itself does not have to be modified. Plate (8), as shown, may be a plastic sheet of, for example, PVC. This plate bears a set of closely spaced grooves 2, machined on it, to tightly and securely hold the metal arc shim elements. The grooves 2 are formed in all locations where positive shim elements may be added to the magnet. The plastic plate (8) is affixed, preferably bolted, onto the metal plate (6), with the side of the plastic plate (8) holding the arcs facing tile side of the metal plate (6) having the grooves, as shown at 10 in FIGS. 4(*a*) and 4(*b*). Alternatively, only the plastic sheet plate (8) may be used to hold the shim elements in place against the magnet, if only positive symmetry components are modified or if grooves are machined directly into the magnet. In another alternative embodiment, the metal plate 6 may be replaced by an additional non-metal plate 8. Again, the suitability of this embodiment depends on the symmetry components to be modified for the particular embodiment, and may or may not require having grooves machined into the magnet. In many cases, this embodiment would be preferable to that in which both plates (6) and (8) are used.

In a preferred embodiment of the present invention, the thickness of each plate is 0.25 inches. The width of the grooves, for both the metal and plastic plates, is preferably 0.062 inches and 0.125 inches. The depth is different for each set of grooves in the metal plate (6), depending on the amount of metal required to cancel the corresponding term.

The present invention has been described by way of example and in terms of preferred embodiments. However, it is to be understood that the present invention is not strictly limited to the disclosed embodiments. To the contrary, various modifications, as well as similar arrangements, are included within the spirit and scope of the present invention. The scope of the appended claims, therefore, should be accorded the broadest possible interpretation so as to encompass all such modifications and similar arrangements.

What is claimed is:

1. A method for passively shimming a magnet to control a three-dimensional field, comprising:

measuring a magnetic field produced within a predetermined volume by the magnet, at selected points within the volume;

modeling the measured magnetic field in the form of a finite plurality of additive components, wherein a sum of all of the plurality of additive components completely describes the measured magnetic field, without approximation due to truncation of terms;

detecting the degree of homogeneity in the measured field within the predetermined volume by examining measured magnetic field values at ones of the selected points corresponding to individual ones of the plurality of additive components;

determining which additive component should be modified in order to change the homogeneity detected in the measured field; and coupling a metal element that provides the determined additive component modification to the measured magnetic field when coupled to the magnet;

wherein the additive components are $g_i$ such that for the field $$f(x, y, z) = \sum_{i=1}^{8} g_i,$$

$8g_1 = f(x, y, z) + f(-x, y, z) + f(x, -y, z) + f(-x, -y, z) + f(x, y, -z) + f(-x, y, -z) + f(x, -y, -z) + f(-x, -y, -z);$ $8g_2 = f(x, y, z) + f(-x, y, z) + f(x, -y, z) + f(-x, -y, z) - f(x, y, -z) - f(-x, y, -z) - f(x, -y, -z) - f(-x, -y, -z);$ $8g_3 = f(x, y, z) + f(-x, y, z) - f(x, -y, z) - f(-x, -y, z) + f(x, y, -z) + f(-x, y, -z) - f(x, -y, -z) - f(-x, -y, -z);$ $8g_4 = f(x, y, z) + f(-x, y, z) - f(x, -y, z) - f(-x, -y, z) - f(x, y, -z) - f(-x, y, -z) + f(x, -y, -z) + f(-x, -y, -z);$ $8g_5 = f(x, y, z) - f(-x, y, z) + f(x, -y, z) - f(-x, -y, z) + f(x, y, -z) - f(-x, y, -z) + f(x, -y, -z) - f(-x, -y, -z);$ $8g_6 = f(x, y, z) - f(-x, y, z) + f(x, -y, z) - f(-x, -y, z) - f(x, y, -z) + f(-x, y, -z) - f(x, -y, -z) + f(-x, -y, -z);$ $8g_7 = f(x, y, z) - f(-x, y, z) - f(x, -y, z) + f(-x, -y, z) + f(x, y, -z) - f(-x, y, -z) - f(x, -y, -z) + f(-x, -y, -z);$ and $8g_8 = f(x, y, z) - f(-x, y, z) - f(x, -y, z) + f(-x, -y, z) - f(x, y, -z) + f(-x, y, -z) + f(x, -y, -z) - f(-x, -y, -z);$ wherein x, y, and z are coordinates in a three-dimensional coordinate system, and the summation of the additive components completely describes the measured field f(x, y, z) without truncating terms.

2. The method of claim 1, further comprising utilizing the modified measured magnetic field produced by the magnet having the coupled magnetic element to perform a magnetic resonance imaging procedure.

3. The method of claim 1, further comprising removing a portion of the magnet corresponding to the metal element in order to modify the determined additive component.

4. The method of claim 3, wherein the removed portion is a groove.

5. The method of claim 4, wherein the groove has a width of about 0.062 inches.

6. The method of claim 4, wherein the groove has a width of about 0.125 inches.

7. The method of claim 1, wherein the metal element is a shim.

8. The method of claim 7, further comprising coupling the shim to a pole of the magnet assembly.

9. The method of claim 8, wherein the shim is a metal ring.

10. The method of claim 8, wherein the shim is an arcuate metal element.

11. The method of claim 7, further comprising attaching a non-metallic cover plate to the magnet, wherein the cover plate includes grooved portions for holding the shim in place in a predetermined location with respect to the pole of the magnet assembly.

12. The method of claim 11, wherein the grooved portion has a width of about 0.062 inches.

13. The method of claim 11, wherein the grooved portion has a width of about 0.125 inches.

14. The method of claim 11, wherein the non-metallic cover plate is a first non-metallic cover plate, and further comprising disposing a second non-metallic cover plate between the magnet and the first non-metallic cover plate, such that the shim is held in the predetermined location between the first and second non-metallic cover plates.

15. The method of claim 11, further comprising disposing a metal plate such that the metal plate affects the magnetic field produced by the magnet, and such that the shim is held in the predetermined location between the metal plate and the cover plate.

16. The method of claim 15, wherein the cover plate and the metal plate each have a thickness of about 0.25 inches.

17. The method of claim 15, further comprising removing a portion of the metal plate corresponding to the metal element in order to modify the determined additive component.

18. The method of claim 17, wherein the removed portion is a groove.

19. The method of claim 18, wherein the groove has a width of about 0.062 inches.

20. The method of claim 18, wherein the groove has a width of about 0.125 inches.

21. An apparatus for changing a homogeneity of a three-dimensional measured magnetic field produced by a magnet having a pole, comprising:

a first plate for placement near enough to the pole of the magnet so as to have an effect on the measured magnetic field;

a shim for placement near enough to the first plate so as to have an effect on the measured magnetic field; and a second plate for attachment to the first plate such that the shim is held in place in a predetermined location between the first plate and the second plate;

wherein the shim corresponds to a magnitude change of an additive component of an equation describing the measured magnetic field, in order to change the homogeneity of the measured magnetic field;

wherein the equation consists of a finite plurality of additive components, the sum of which completely describes the measured magnetic field, without approximation due to truncation of terms, such that $$f(x, y, z) = \sum_{i=1}^{8} g_i,$$

and the additive component is one of $g_i$, $i=\{1,2,3,4,5,6,7,8\}$, wherein $8g_1=f(x, y, z)+f(-x, y, z)+f(x, -y, z)+f(-x, -y, z)+f(x, y, -z)+f(-x, y, -z)+f(x, -y, -z)+f(-x, -y, -z);$ $8g_2=f(x, y, z)+f(-x, y, z)+f(x, -y, z)+f(-x, -y, z)-f(x, y, -z)-f(-x, y, -z)-f(x, -y, -z)-f(-x, -y, -z);$ $8g_3=f(x, y, z)+f(-x, y, z)-f(x, -y, z)-f(-x, -y, z)+f(x, y, -z)+f(-x, y, -z)-f(x, -y, -z)-f(-x, -y, -z);$ $8g_4=f(x, y, z)+f(-x, y, z)-f(x, -y, z)-f(-x, -y, z)-f(x, y, -z)-f(-x, y, -z)+f(x, -y, -z)+f(-x, -y, -z);$ $8g_5=f(x, y, z)-f(-x, y, z)+f(x, -y, z)-f(-x, -y, z)+f(x, y, -z)-f(-x, y, -z)+f(x, -y, -z)-f(-x, -y, -z);$ $8g_6=f(x, y, z)-f(-x, y, z)+f(x, -y, z)-f(-x, -y, z)-f(x, y, -z)+f(-x, y, -z)-f(x, -y, -z)+f(-x, -y, -z);$ $8g_7=f(x, y, z)-f(-x, y, z)-f(x, -y, z)+f(-x, -y, z)+f(x, y, -z)-f(-x, y, -z)-f(x, -y, -z)+f(-x, -y, -z);$ and $8g_8=f(x, y, z)-f(-x, y, z)-f(x, -y, z)+f(-x, -y, z)-f(x, y, -z)+f(-x, y, -z)+f(x, -y, -z)-f(-x, -y, -z);$ wherein the additive component has a particular symmetry with respect to a three-dimensional coordinate system oriented with respect to a location of the pole.

22. The apparatus of claim 21, wherein the pole is disposed on the z-axis.

23. The apparatus of claim 21, wherein the additive component is a first additive component having a first particular symmetry with respect to the three-dimensional coordinate system, the first plate includes a grooved portion that corresponds to a magnitude change of a second additive component of the equation describing the measured magnetic field, in order to change the homogeneity of the measured magnetic field, and the second additive component has a second particular symmetry with respect to the three dimensional coordinate system.

24. The apparatus of claim 21, wherein the additive component is a first additive component having a first particular symmetry with respect to the three-dimensional coordinate system, the magnet includes a grooved portion that corresponds to a magnitude change of a second additive component of the equation describing the measured magnetic field, in order to change the homogeneity of the measured magnetic field, and the second additive component has a second particular symmetry with respect to the three-dimensional coordinate system.

25. The apparatus of claim 21, further comprising the magnet that produces the three-dimensional measured magnetic field.

26. The apparatus of claim 25, comprising a magnetic resonance imaging system including the magnet.

* * * * *